(12) United States Patent
Choi et al.

(10) Patent No.: US 8,084,939 B2
(45) Date of Patent: Dec. 27, 2011

(54) ORGANIC LIGHT EMITTING DISPLAY AND FABRICATING METHOD THEREOF

(75) Inventors: Jun-Ho Choi, Yongin-si (KR);
Seong-Min Kim, Anyang-si (KR);
Jin-Koo Chung, Suwon-si (KR);
Jae-Kook Ha, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 187 days.

(21) Appl. No.: 12/458,569

(22) Filed: Jul. 16, 2009

(65) Prior Publication Data
US 2010/0194268 A1    Aug. 5, 2010

(30) Foreign Application Priority Data
Feb. 2, 2009   (KR) .......................... 10-2009-0008179

(51) Int. Cl.
*H01J 1/62* (2006.01)
(52) U.S. Cl. .......................... 313/506; 313/504; 313/509
(58) Field of Classification Search ........... 313/498–512
See application file for complete search history.

(56) References Cited

U.S. PATENT DOCUMENTS
2002/0093284 A1* 7/2002 Adachi et al. ................. 313/506
2007/0003743 A1* 1/2007 Asano et al. ................... 428/201
2007/0123135 A1  5/2007 Yang
2008/0085478 A1* 4/2008 Kobayashi et al. ........... 430/324

FOREIGN PATENT DOCUMENTS

| JP | 2007-279719 | 10/2007 |
|----|-------------|---------|
| KR | 1020060044263 | 5/2006 |
| KR | 1020060103181 | 9/2006 |
| KR | 1020060134260 | 12/2006 |
| KR | 1020070000029 | 1/2007 |
| KR | 1020070001658 | 1/2007 |
| KR | 1020070004566 | 1/2007 |
| KR | 1020070037114 | 4/2007 |
| KR | 1020070056509 | 6/2007 |
| KR | 1020070066257 | 6/2007 |
| KR | 1020070069427 | 7/2007 |
| KR | 1020070111610 | 11/2007 |
| KR | 1020070121091 | 12/2007 |
| KR | 1020080002421 | 1/2008 |

* cited by examiner

*Primary Examiner* — Bumsuk Won
(74) *Attorney, Agent, or Firm* — H.C. Park & Associates, PLC

(57) ABSTRACT

An organic light emitting display according to an exemplary embodiment of the present invention includes a first pixel to represent a white color, a second pixel to represent a different color from the first pixel, a pixel electrode disposed in each of the first and the second pixels, an organic light emitting member disposed on the pixel electrode, and a common electrode disposed on the organic light emitting member. The first pixel includes a first emission area and a first optical filter, and the second pixel includes a second emission area and a second optical filter.

17 Claims, 7 Drawing Sheets
(1 of 7 Drawing Sheet(s) Filed in Color)

ORGANIC LIGHT EMITTING DISPLAY AND FABRICATING METHOD THEREOF

CROSS REFERENCE TO RELATED APPLICATION

This application claims priority from and the benefit of Korean Patent Application No. 10-2009-0008179, filed on Feb. 2, 2009, which is hereby incorporated by reference for all purposes as if fully set forth herein.

BACKGROUND OF THE INVENTION

1. Field of the Invention

Exemplary embodiments of the present invention relate to an organic light emitting display and a fabricating method thereof.

2. Discussion of the Background

An organic light emitting display ("OLED") includes a plurality of pixels. Each pixel includes an organic light emitting element and at least one thin film transistor for driving it.

The organic light emitting element includes an anode, a cathode, and an organic light emitting member there between. The organic light emitting member represents a primary color such as red, green or blue, or white color.

Currently, a color filter laminated on a white organic light emitting member has been developed to form an organic light emitting display with large screen and full color. When a color filter is used, light efficiency decreases. A white color pixel may be used in the organic light emitting display to improve the decreased light efficiency.

However, when the white color pixel is added, ambient light is reflected by a highly reflective metal used for the anode or cathode resulting in a reduced contrast ratio.

A polarizer may be formed on the whole surface of the organic light emitting display to improve the reduced contrast ratio resulting from the white color pixel. Using the polarizer may reduce light efficiency.

SUMMARY OF THE INVENTION

Exemplary embodiments of the present invention provide an organic light emitting display that may have improved contrast ratio and light efficiency.

Additional features of the invention will be set forth in the description which follows, and in part will be apparent from the description, or may be learned by practice of the invention.

An exemplary embodiment of the present invention discloses an organic light emitting display having a first pixel to represent a white color; a second pixel to represent a color different from the first pixel; a pixel electrode disposed in each of the first pixel and the second pixel; an organic light emitting member disposed on the pixel electrode; and a common electrode Is disposed on the organic light emitting member, wherein the first pixel has a first emission area and a first optical filter, and the second pixel has a second emission area and a second optical filter.

An exemplary embodiment of the present invention also discloses an organic light emitting display having a substrate; a light blocking member with an opening disposed on the substrate; a semi-light blocking member that is part of the same layer as the light blocking member, the semi-light blocking member being thinner than the light blocking member; a color filter disposed in the area corresponding to the opening in the light blocking member; a pixel electrode disposed on the color filter; a white organic light emitting member disposed on the pixel electrode; and a common electrode disposed on the organic light emitting member.

An exemplary embodiment of the present invention also discloses an organic light emitting display having a first substrate; a pixel electrode disposed on the first substrate; a white organic light emitting member disposed on the pixel electrode; a common electrode disposed on the white organic light emitting member; a color filter disposed on the common electrode; a light blocking member with an opening disposed on the common electrode; a semi-light blocking member that is part of the same layer as the light blocking member; and, a second substrate disposed on the light blocking member and the semi-light blocking member, wherein the opening of the light blocking member is disposed in the area corresponding to the color filter.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
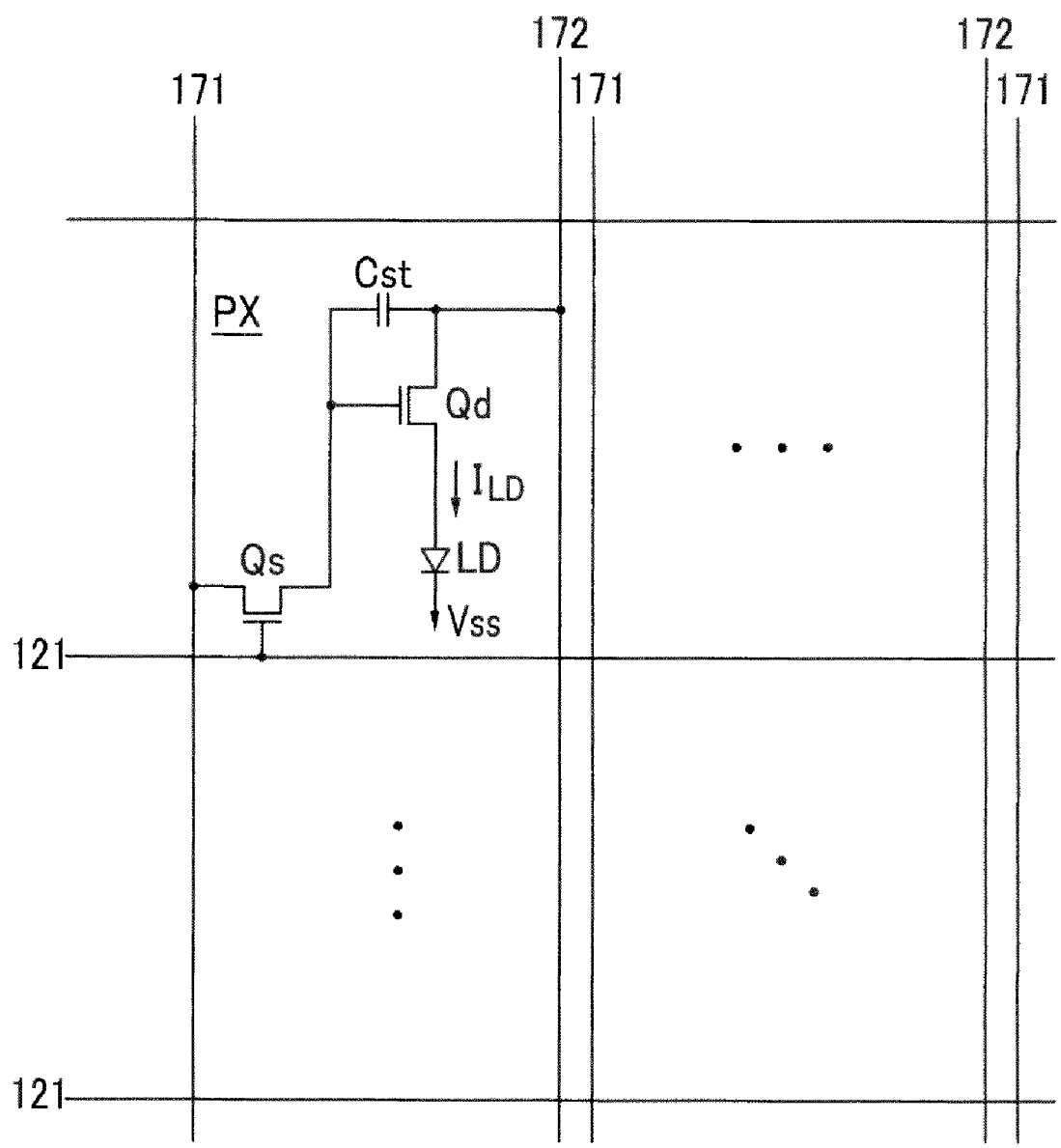
FIG. 1 is an equivalent circuit of an organic light emitting display according to an exemplary embodiment of the present invention.

The invention is described more fully hereinafter with reference to the accompanying drawings, in which embodiments of the invention are shown. This invention may, however, be embodied in many different forms and should not be construed as limited to is the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is an equivalent circuit of an organic light emitting display according to an exemplary embodiment of the present invention. Referring to FIG. 1, an OLED 10 according to an exemplary embodiment of the present invention includes a plurality of signal lines 121, 171, and 172, and a plurality of pixels PX arranged in a matrix. The signal lines include gate lines 121, data lines 171, and driving voltage lines 172. Each gate line 121 transmits a gate signal (i.e. scan signal). Each data line 171 transmits a data signal, and each driving voltage line 172 transmits a driving voltage. The gate lines 121 extend in a row direction and are parallel to each other. The data lines 171 and the driving voltage lines 172 extend in a column direction and are parallel to each other.

Each pixel PX has a switching transistor Qs, a driving transistor Qd, a storage capacitor Cst, and an organic light emitting element LD.

The switching transistor Qs includes a control terminal, an input terminal, and an output terminal. The control terminal is connected to the gate line 121, and the input terminal is connected to the data line 171. The output terminal is connected to the driving transistor Qd. The switching transistor Qs transmits the data signal received from the data line 171 to the driving transistor Qd in response to the gate signal received from the gate line 121.

The driving transistor Qd includes a control terminal, an input terminal, and an output terminal. The control terminal is connected to the switching transistor Qs, and the input terminal is connected to the driving voltage line 172. The output terminal is connected to the organic light emitting element LD. The output current $I_{LD}$ of the driving transistor. Qd is a function of a voltage difference between the control terminal and the output terminal.

The storage capacitor Cst is connected between the control terminal and the input terminal of the driving transistor Qd. The storage capacitor Cst stores the data signal applied to the control terminal of the driving transistor Qd and maintains it after the switching transistor Qs turns off.

The organic light emitting element LD includes a pixel electrode connected to the output terminal of the driving transistor Qd and a common electrode connected to a common voltage Vss. The organic light emitting element LD displays an image depending on the output current $I_{LD}$ of the driving transistor Qd.

The switching transistor Qs and the driving transistor Qd can include an n type transistor. However, at least one of the switching transistor Qs or the driving transistor Qd may be a p type transistor. Also, the connection between the transistors Qs and Qd, the storage capacitor Cst, and the organic light emitting element LD can be changed. Other transistors may be further included in the pixel PX to compensate a threshold voltage of the driving transistor or the organic light emitting element LD.

Figure 2:
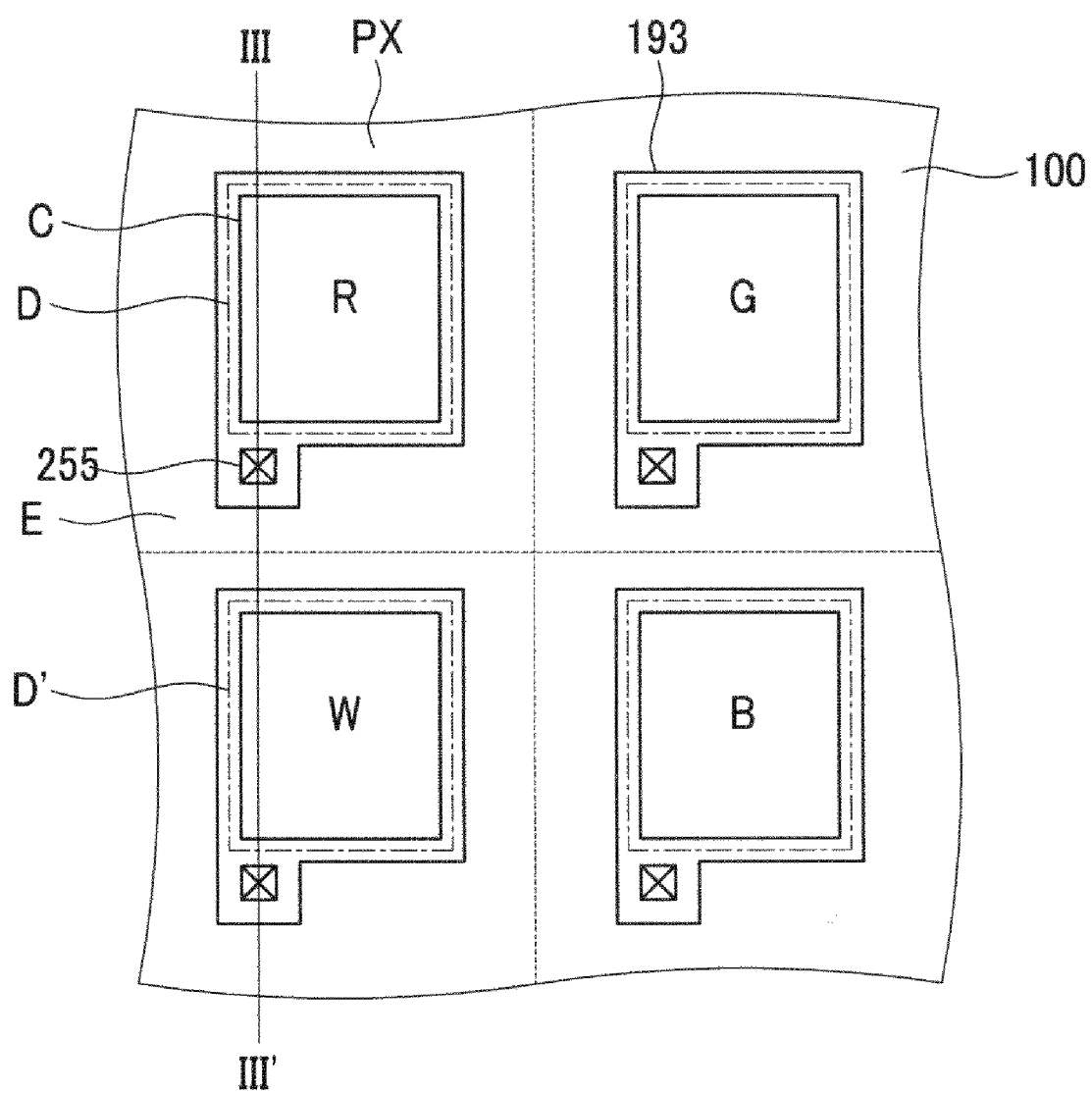
FIG. 2 is a layout view of an organic light emitting display according to an exemplary embodiment of the present invention.
Figure 3:
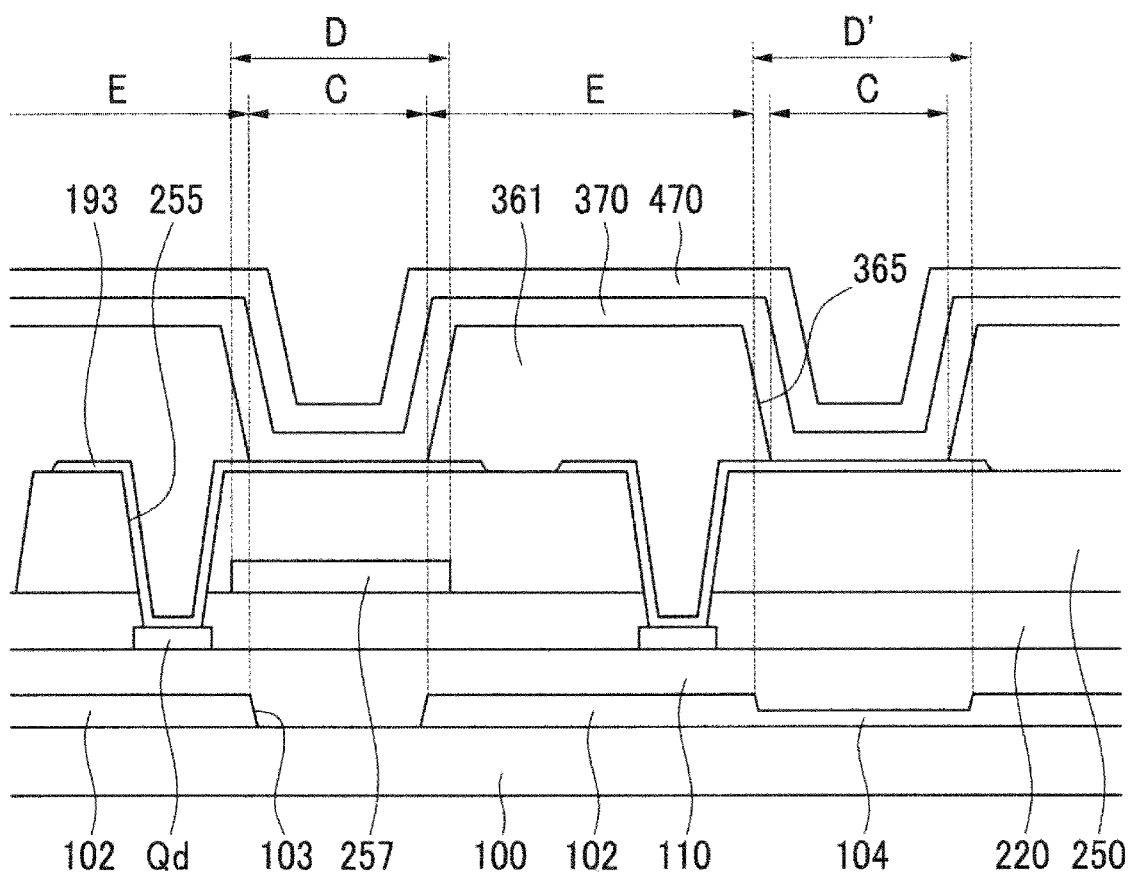
FIG. 3 is a sectional view taken along line III-III' of FIG. 2.

FIG. 2 is a layout view of an organic light emitting display such as the organic light emitting display of FIG. 1 according to an exemplary embodiment of the present invention, and FIG. 3 is a sectional view taken along line III-III' of FIG.2.

Referring to FIG. 2, an organic light emitting display includes a plurality of red pixels R, green pixels G, blue pixels B, and white pixels W. Each pixel PX includes an emission area C, a color filter area D or a semi-light blocking area D', and a light blocking area E.

The emission area C is an area where light emits, the color filter area D is an area where a color filter is formed, and the semi-light blocking area D' is an area where a semi-light blocking member is formed. The red pixel R, the green pixel G, and the blue pixel B include the color filter areas D with a color filter. On the other hand, the white pixel W includes the semi-light blocking area D' with a semi-light blocking member. A portion of light penetrates through the semi-light blocking member and a portion of light is blocked by the semi-light blocking member. The light blocking area E is an area where a light blocking member is formed. The light blocking member absorbs light, thereby preventing light from penetrating therethrough.

The color filter area D can be larger than and surround the emission area C. That is, an edge of color filter can be disposed outside an edge of the emission area C.

The semi-light blocking area D' can be larger than and surround the emission area C. That is, an edge of semi-light blocking area D' can be disposed outside an edge of the emission area C. In another embodiment, an edge of semi-light blocking area D' can coincide with an edge of emission area C.

Each pixel PX includes a pixel electrode 193 and a contact hole 255. As FIG. 3 shows, the pixel electrode 193 is electrically connected to driving transistor Qd via the contact hole 255.

The organic light emitting display of FIG. 2 is described in detail with reference to FIG. 3.

A light blocking member 102 including an opening 103 is formed on an insulating substrate 100. The insulating substrate 100 can include glass, quartz, ceramic, or plastic. The light blocking member 102 can include a double layered structure of chrome oxide and chrome (CrOx/Cr) or nickel oxide and nickel (NiOx/Ni). The light blocking member 102 has a thickness of about 150 nm to about 250 nm.

Referring to FIG. 2 and FIG. 3, the opening 103 is disposed in the area corresponding to each of the red pixel R, the green pixel G, and the blue pixel B. The light blocking member 102 is formed in the area outside the emission area C.

A semi-light blocking member 104 is disposed in the area corresponding to the white pixel W to form the semi-light blocking area D'. A portion of light penetrates through the semi-light blocking member 104 and a portion of light is blocked by the semi-light blocking member 104. In other words, the semi-light blocking member 104 functions as an optical filter. The semi-light blocking member 104 can include a double layered structure of CrOx/Cr or NiOx/Ni. The semi-light blocking member 104 can have a thickness of about 4 nm to about 20 nm.

An insulating layer 110 is formed on the light blocking member 102, the semi-light blocking member 104, and a portion of the insulating substrate 100.

A plurality of driving transistors Qd is formed on the insulating layer 110. A thin film structure 220 including a switching transistor, such as the switching transistor Qs of FIG. 1, can be formed on the insulating layer 110. The thin film structure 220 can include an insulating layer covering or a thin film layer under the plurality of driving transistors Qd.

A color filter 257 is formed on the thin film structure 220 in the area corresponding to the color filter area D. The color filter 257 can include a red, green, or blue color filter, thereby causing each pixel PX to represent one color of red, green, or blue. The color filter 257 blocks colors other than the associated color to function as an optical filter.

As FIG. 3 shows, a color filter is not formed in the white pixel W.

An organic layer 250 is formed on the thin film structure 220 and the color filter 257. The organic layer 250 can include polyacrylate or a flattening layer.

The organic layer 250 and the thin film structure 220 have a plurality of contact holes 255 in the area corresponding to the driving transistors Qd.

A plurality of pixel electrodes 193 is formed on the organic layer 250. The pixel electrode 193 is connected to the associated driving transistor Qd through the contact hole 255. The pixel electrode 193 includes a transparent conductive layer such as indium tin oxide (ITO) or indium zinc oxide (IZO).

A partition wall 361 is formed on the pixel electrode 193. The partition wall 361 has a plurality of openings 365. The partition wall 361 can include polyimide. The opening 365 is disposed in the emission area C. A white organic light emitting member 370 is formed on the pixel electrode 193 in the opening 365 and the partition wall 361.

A common electrode 470 is formed on the white organic light emitting member 370 and transmits a common voltage Vss. The common electrode 470 includes calcium (Ca), barium (Ba), magnesium (Mg), aluminum (Al), silver (Ag), or alloy thereof The pixel electrode 193, the white organic light emitting member 370, and the common electrode 470 form the organic light emitting element LD of FIG. 1. The pixel electrode 193 can be an anode, and the common electrode 470 can be a cathode.

The organic light emitting display can display images by radiating light through the color filter 257 and the semi-light blocking member 104. Light, which penetrates through the color filter 257, represents one of red, green, or blue. Light, which penetrates through the semi-light blocking member 104, represents white.

According to an exemplary organic light emitting display, the semi-light blocking member 104 disposed in the white pixel W causes light emitted from the white organic light emitting member 370 to radiate outwardly, thereby improving an optical efficiency. Also, the semi-light blocking member 104 blocks a portion of ambient light which is reflected by the anode or the cathode of the organic light emitting element, thereby increasing contrast ratio.

Figure 4A:
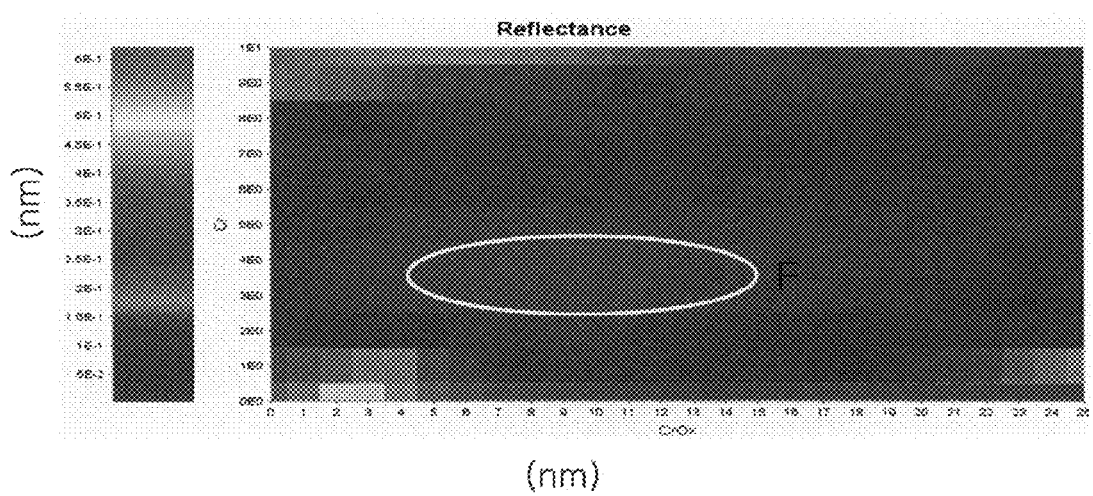
FIG. 4A and FIG. 4B are graphs for illustrating reflectance and luminance of an organic light emitting display according to an exemplary embodiment of the present invention.
Figure 4B:
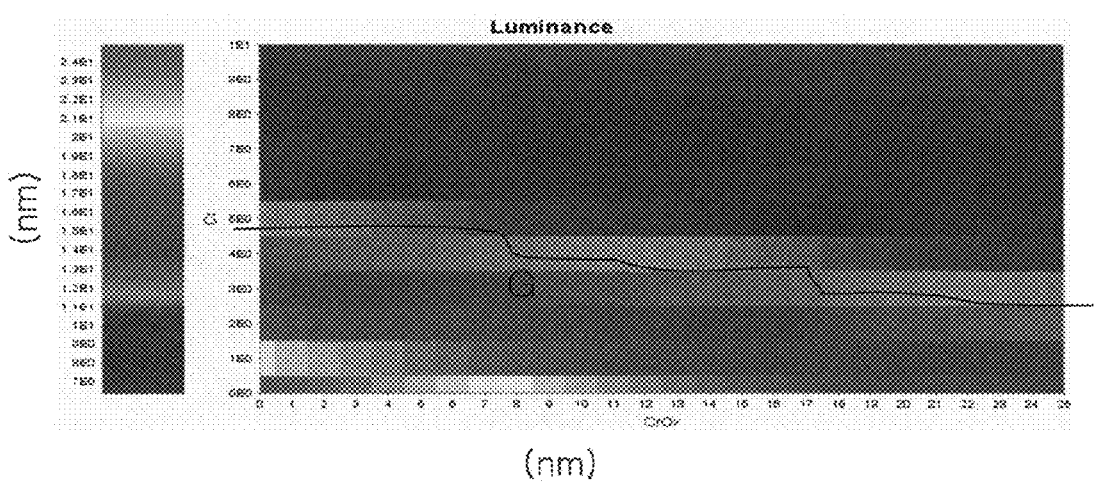

FIG. 4A and FIG. 4B are graphs for illustrating reflectance and luminance of the organic light emitting display according to an exemplary embodiment of the present invention.

FIG. 4A shows simulated reflectance with thickness of CrOx/Cr in an organic light emitting display. The organic light emitting display includes CrOx/Cr, an insulating layer that includes silicon oxide, a thin film structure that includes silicon nitride, an organic layer, a transparent conductive layer that includes indium tin oxide, an organic light emitting member, and a common electrode. Dimensionally, the insulating layer is 750 nm thick, the thin film structure is 900 nm thick, the organic layer is 2.4 μm thick, the transparent conductive layer is 90 nm thick, the organic light emitting member is 280 nm thick, and the common electrode is 200 nm thick.

The region F indicates a range where the reflectance of the organic light emitting display is equal to or less than 0.01.

FIG. 4B shows simulated luminance with thickness of CrOx/Cr in an organic light emitting display. The organic light emitting display is the same with that of FIG. 4A.

The solid line G indicates a range where luminance of light emitted from the organic light emitting display is equal to or more than 50% of luminance in an organic light Is emitting display without CrOx/Cr. For example, when the luminance of an organic light emitting display without CrOx/Cr is 24 cd/A, the solid line G indicates a range where luminance is equal to or larger than 12 cd/A.

Referring to FIG. 4A and FIG. 4B, in the event that CrOx has a thickness of about 2 nm to about 16 nm and Cr has a thickness of about 2 nm to about 4.5 nm, reflectance is equal to or less than 0.01 and luminance is equal to or more than 50%. Reflectance and luminance varies with a thickness of a light blocking member such as CrOx/Cr. The thickness of the light blocking member depends on thickness or type of a thin film such as an insulating layer, a thin film structure, an organic layer, a pixel electrode, an organic light emitting member, or a common electrode, which is included in an organic light emitting display.

When reflectance is equal to or less than 0.01 and luminance is equal to or more than 50%, the light blocking member functions as a semi-light blocking member which can transmit equal to or more than 50% of light emitted from an organic light emitting member. Reflectance and luminance can be controlled with a required characteristic of an organic light emitting display.

According to an exemplary embodiment of the present invention, an organic light emitting display with a semi-light blocking member has a contrast ratio similar to one with a polarizer. Optical efficiency improves about 50% from 6.5 cd/A to 10.2 cd/A when an organic light emitting display includes a semi-light blocking member without a polarizer.

FIG. 5, FIG. 6, FIG. 7, and FIG. 8 illustrate a method of manufacturing an organic light emitting display of FIG. 2 and FIG. 3 according to an exemplary embodiment of the present invention.

Figure 5:
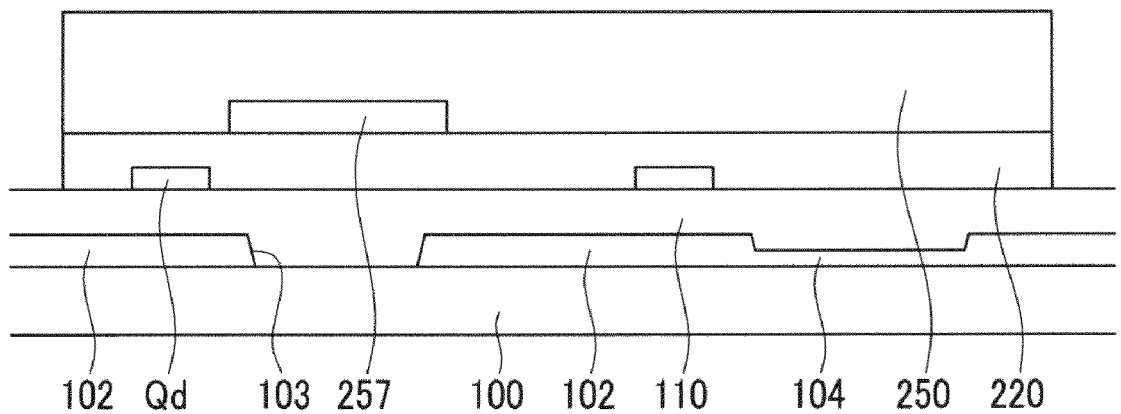
FIG. 5, FIG. 6, FIG. 7, and FIG. 8 illustrate a method of manufacturing an organic light emitting display according to an exemplary embodiment of the present invention.

Referring to FIG. 5, a metal oxide layer and a metal layer including CrOx/Cr or NiOx/Ni are formed on an insulating substrate 100. The metal oxide and the metal layer are patterned to form a semi-light blocking member 104 and a light blocking member 102, which includes an opening 103. Referring to FIG. 2, the semi-light blocking member 104 is disposed in the area corresponding to an emission area C of a white pixel W. The opening 103 is disposed in an emission area C of a red pixel R, a green pixel G, or a blue pixel B. The light blocking member 102 has a thickness about 150 nm to about 250 nm, and the semi-light blocking member 104 has a thickness about 4 nm to about 20 nm.

An insulating layer 110 is formed on the light blocking member 102, the semi-light blocking member 104, and the insulating substrate 100. A thin film structure 220, including a plurality of driving transistors Qd, is formed on the insulating layer 110. A color filter 257 is formed on the thin film structure 220 in a color filter area D of a red, a green, or a blue pixel, as illustrated in FIG. 2. The color filter 257 is disposed in the area corresponding to the opening 103. The color filter 257 can cover the opening 103.

An organic layer 250 is formed on the color filter 257 and the thin film structure 220.

Figure 6:
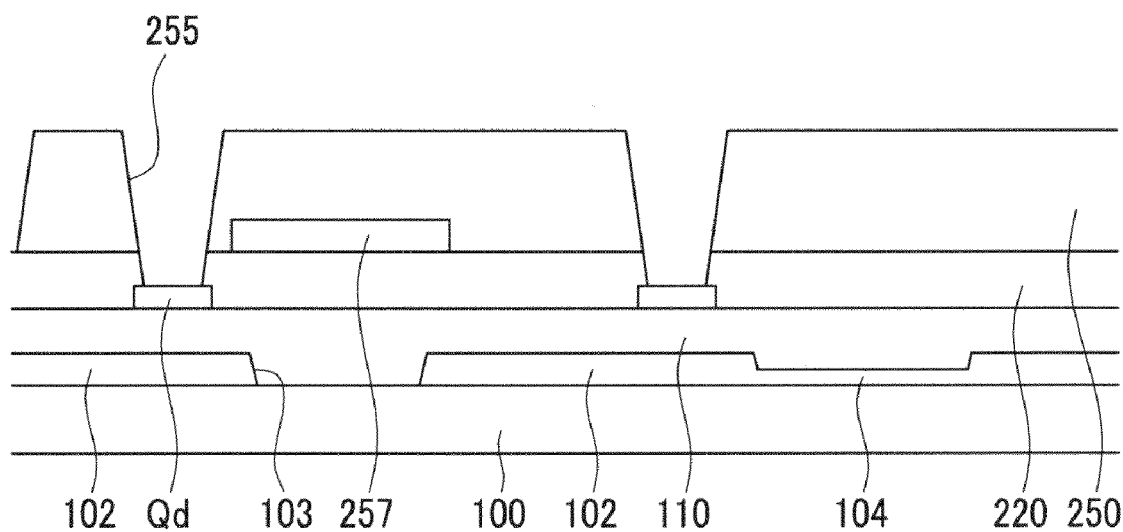

Referring to FIG. 6, the organic layer 250 and the thin film structure 220 are patterned to form a plurality of contact holes 255 to expose a portion of the driving transistor Qd.

Figure 7:
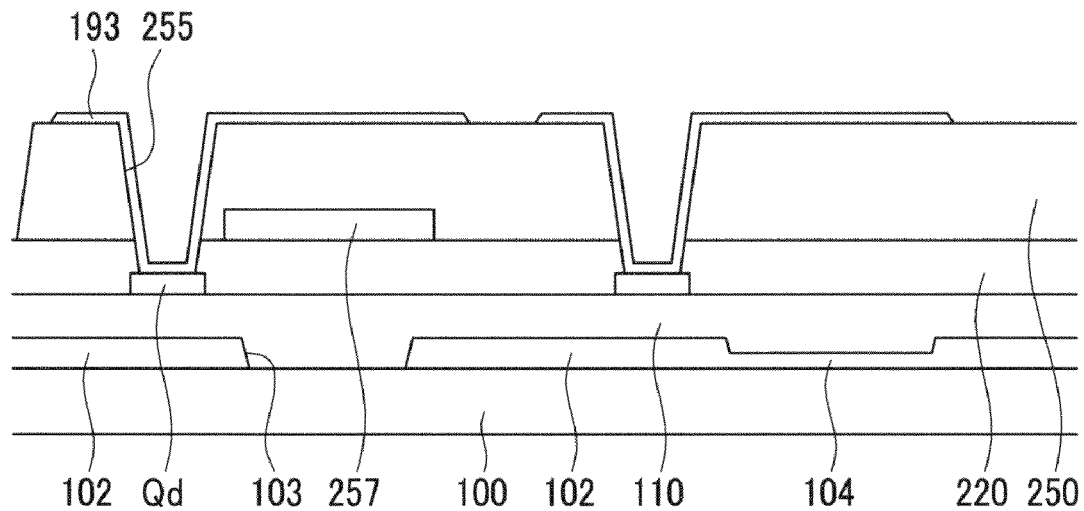

Referring to FIG. 7, a transparent conductive layer such as indium tin oxide or indium zinc oxide is formed on the organic layer 250 and patterned to form pixel electrodes 193. The pixel electrode 193 is connected to the driving transistor Qd through the contact hole 255.

Figure 8:
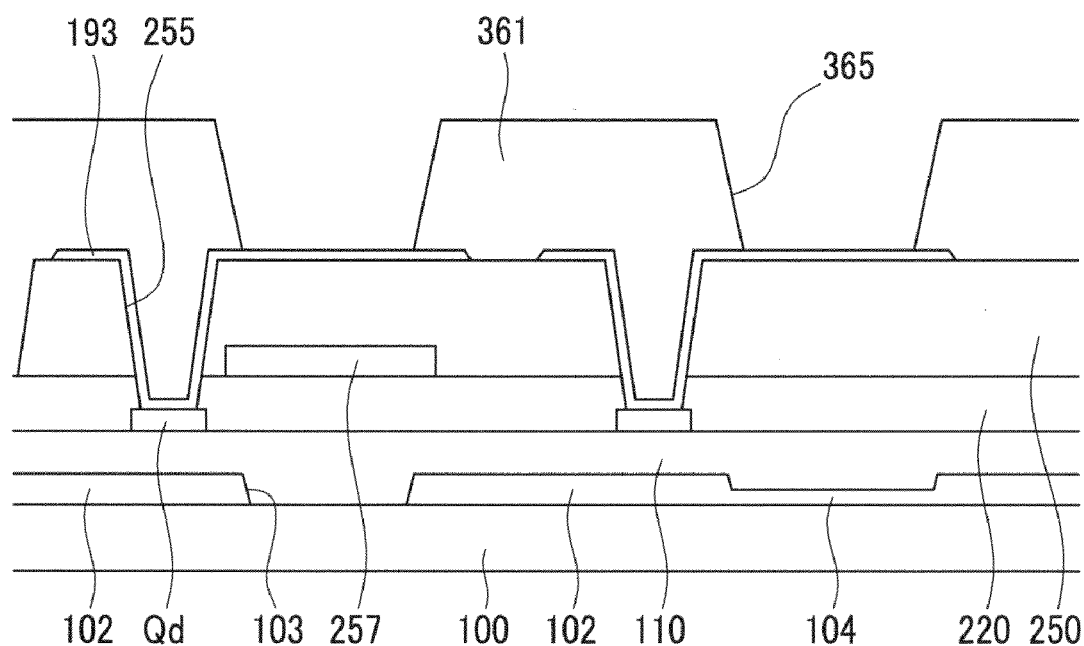

Referring to FIG.8, an insulating material such as a photosensitive organic material is deposited and patterned to form a partition wall 361 having openings 365. The openings 365 expose a portion of the pixel electrodes 193. The partition wall 361 can include non-photosensitive materials.

Referring to FIG. 3, a white organic light emitting member 370 is formed in the opening 365 and on the partition wall 361. A common electrode 470 is formed on the partition wall 361 and the white organic light emitting member 370.

Figure 9:
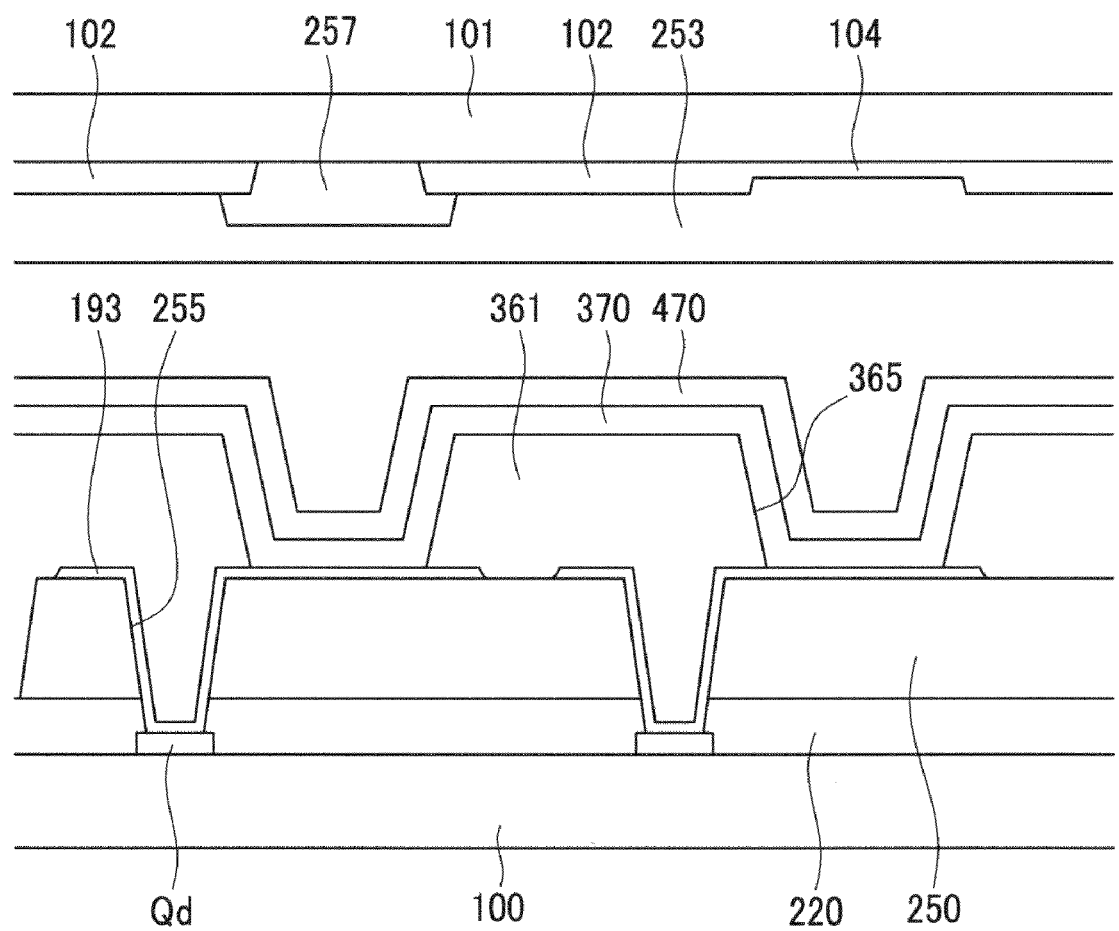
FIG. 9 is a sectional view of an exemplary organic light emitting display according to another exemplary embodiment of the present invention.

FIG. 9 is a sectional view of an exemplary organic light emitting display according to another exemplary embodiment of the present invention. This embodiment is substantially identical to the embodiment illustrated in FIG. 3.

Referring to FIG. 9, a light blocking member 102 having an opening 103 and a semi-light blocking member 104 are formed on an upper substrate 101. The upper substrate 101 includes an insulating substrate such as glass or plastic. The light blocking member 102 and the semi-light blocking member 104 can include CrOx/Cr or NiOx/Ni, and the same material. The semi-light blocking member 104 is thinner than the light blocking member 102.

A color filter 257 is formed in the opening 103. The color filter 257 can cover a portion of the light blocking member 102.

A flattening layer 253 can be formed on the color filter 257, the light blocking member 102, and the semi-light blocking member 104.

The upper substrate 101, on which the light blocking member 102, the semi-light blocking member 104, the color filter 257, and the flattening layer 253 are formed, is disposed on a substrate 100. A plurality of driving transistors Qd, pixel electrodes 193, a partition wall 361 including openings 365, a white organic light emitting member 370, and a common electrode 470 are formed on the substrate 100.

The color filter 257 is disposed in a color filter area D in a red, a green, or a blue pixel, as illustrated in FIG. 2. The semi-light blocking member 104 is disposed in a semi-light blocking area D' of a white pixel, as also illustrated in FIG. 2. The color filter area D can overlap with a portion of the light blocking area E.

A protective layer (not shown) can be disposed between the common electrode 470 and the flattening layer 253. The protective layer can include organic or inorganic material. In another embodiment, a cavity or an adhesive member can be disposed between the common electrode 470 and the flattening layer 253.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. An organic light emitting display, comprising:
a first pixel to represent a white color, comprising a first emission area;
a second pixel to represent a color different from the first pixel, comprising a second emission area;
a pixel electrode disposed in each of the first pixel and the second pixel;
an organic light emitting member disposed on the pixel electrodes;
a common electrode disposed on the organic light emitting member;
a semi-light blocking member disposed in the first emission area; and
a color filter disposed in the second emission area; and
a light blocking member disposed outside the first emission area and outside the second emission area,
wherein the semi-light blocking member is disposed on the same layer as the light blocking member and is thinner than the light blocking member.
2. The organic light emitting display of claim 1, wherein an edge of the semi-light blocking member adjoins an edge of the light blocking member.
3. The organic light emitting display of claim 2, wherein the semi-light blocking member comprises the same material as the light blocking member.
4. The organic light emitting display of claim 3, wherein the semi-light blocking member comprises one of CrOx/Cr and NiOx/Ni.
5. The organic light emitting display of claim 4, wherein the semi-light blocking member is disposed under the organic light emitting member.
6. The organic light emitting display of claim 4, wherein the semi-light blocking member is disposed on the organic light emitting member.
7. The organic light emitting display of claim 4, wherein the semi-light blocking member has a thickness of 4 nm to 20 nm.
8. The organic light emitting display of claim 1, wherein a portion of the color filter is disposed outside the second emission area.
9. The organic light emitting display of claim 8, wherein the color filter overlaps with a portion of the light blocking member.
10. The organic light emitting display of claim 9, wherein the color filter comprises one of a red filter, a green filter, and a blue filter, and the organic light emitting member comprises a white organic light emitting member.
11. The organic light emitting display of claim 10, wherein the color filter is disposed under the organic light emitting member.
12. The organic light emitting display of claim 11, wherein the light blocking member is disposed under the organic light emitting member.
13. The organic light emitting display of claim 10, wherein the color filter is disposed on the organic light emitting member.
14. The organic light emitting display of claim 13, wherein the light blocking member is disposed on the organic light emitting member.
15. An organic light emitting display, comprising:
a substrate;
a light blocking member with an opening disposed on the substrate;
a semi-light blocking member that is part of the same layer as the light blocking member, the semi-light blocking member being thinner than the light blocking member;
a color filter disposed in the area corresponding to the opening in the light blocking member;
a pixel electrode disposed on the color filter;
a white organic light emitting member disposed on the pixel electrode; and
a common electrode disposed on the organic light emitting member.
16. The organic light emitting display of claim 15, wherein light emitted from the organic light emitting member penetrates through the color filter to represent one of red, green, and blue light and through the semi-light blocking member to represent white light.
17. An organic light emitting display, comprising:
a first substrate;
a pixel electrode disposed on the first substrate;
a white organic light emitting member disposed on the pixel electrode;
a common electrode disposed on the white organic light emitting member;
a color filter disposed on the common electrode;
a light blocking member disposed on the common electrode and comprising an opening that faces the color filter;
a semi-light blocking member that is part of the same layer as the light blocking member, the semi-light blocking layer being thinner than the light blocking member; and
a second substrate disposed on the light blocking member and the semi-light blocking member.

* * * * *